United States Patent
Nair

(10) Patent No.: US 7,291,896 B2
(45) Date of Patent: Nov. 6, 2007

(54) VOLTAGE DROOP SUPPRESSING ACTIVE INTERPOSER

(76) Inventor: Rajendran Nair, 3838 E. Encinas Ave., Gilbert, AZ (US) 85234

( * ) Notice: Subject to any disclaimer, the term of this patent is extended or adjusted under 35 U.S.C. 154(b) by 0 days.

(21) Appl. No.: 10/875,022

(22) Filed: Jun. 24, 2004

(65) Prior Publication Data

US 2005/0285252 A1 Dec. 29, 2005

(51) Int. Cl.
*H01L 27/06* (2006.01)

(52) U.S. Cl. .............................. 257/533; 257/E25.006; 257/532; 257/534; 257/690; 257/777; 361/301.4; 361/306.2

(58) Field of Classification Search ................ 257/690, 257/777, 686, 724, E23.153, E25.029, 924, 257/E25.006, E23.068, E23.079, E23.174, 257/E21.648, 532–534, 927; 361/728, 301.4, 361/306.2
See application file for complete search history.

(56) References Cited

U.S. PATENT DOCUMENTS

| | | | | |
|---|---|---|---|---|
| 5,629,240 A | * | 5/1997 | Malladi et al. | 438/106 |
| 5,936,840 A | * | 8/1999 | Satwinder | 361/728 |
| 6,058,004 A | * | 5/2000 | Duva et al. | 361/301.4 |
| 6,147,886 A | * | 11/2000 | Wittenbreder | 363/95 |
| 6,492,829 B1 | * | 12/2002 | Miura et al. | 324/765 |
| 6,575,766 B1 | * | 6/2003 | Xie et al. | 439/70 |

FOREIGN PATENT DOCUMENTS

JP 10321762 A * 12/1998

* cited by examiner

*Primary Examiner*—Kenneth Parker
*Assistant Examiner*—Chris C. Chu

(57) ABSTRACT

The invention proposes an interposer assembly architecture for noise suppression circuits on the package of a CPU or high power, high frequency VLSI device. In this architecture, charge is stored on dedicated capacitors at a voltage substantially higher than the operating voltage of the VLSI device. These capacitors are mounted upon active circuits that are packaged to match the size and form factor of the capacitors and this assembly is then attached to the package substrate. Charge is conveyed from the capacitor terminals on the backside of the packaged active circuits chip. Depending upon the capacitor construction, these terminals may either be double-sided contact terminals along the edge of the active device's package, or may be feed-through contacts. The active device attaches to the package substrate through both edge terminals and terminals built-up on the surface of the chip, increasing it's number of electrical pathways into the package substrate, matching the package substrate interconnect and reducing the electrical impedance of the charge flow path. The circuits within the active device may be any combination of semiconductor switches and/or voltage regulators, and may also contain voltage and current sensing circuitry.

9 Claims, 2 Drawing Sheets

Transistor Switch, Drive and Packaging Architecture

Diagrams
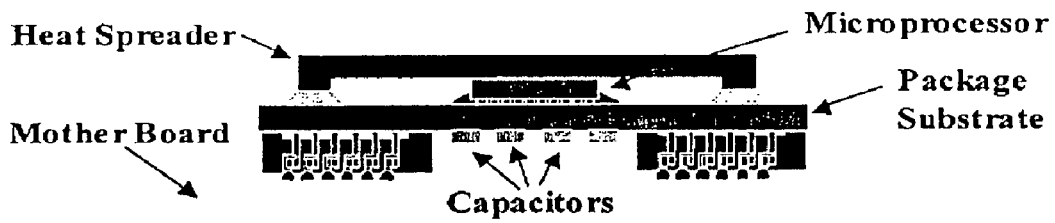
Figure 1: PRIOR ART Assembly of Capacitors onto a CPU Package Substrate
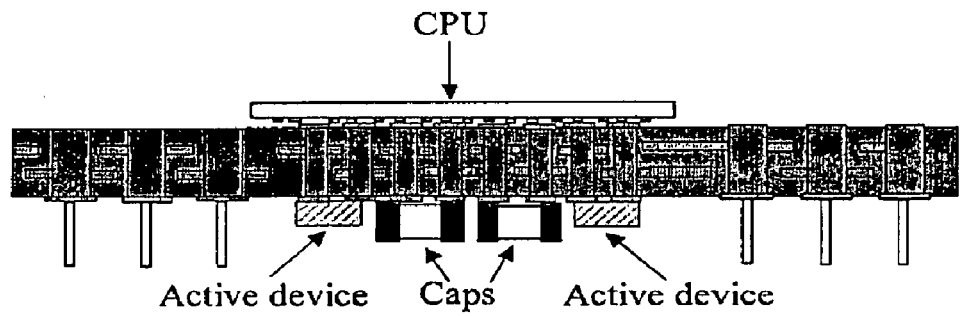
Figure 2: PRIOR ART Placement of Active Devices and Capacitors in a Package
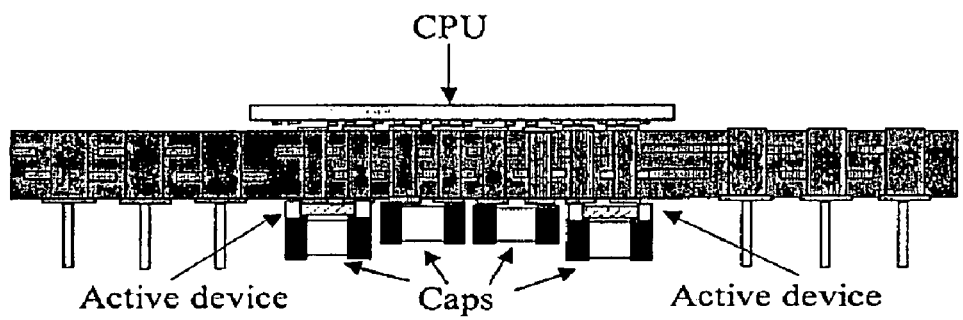
Figure 3: Transient Suppressing Active Interposer packaging architecture

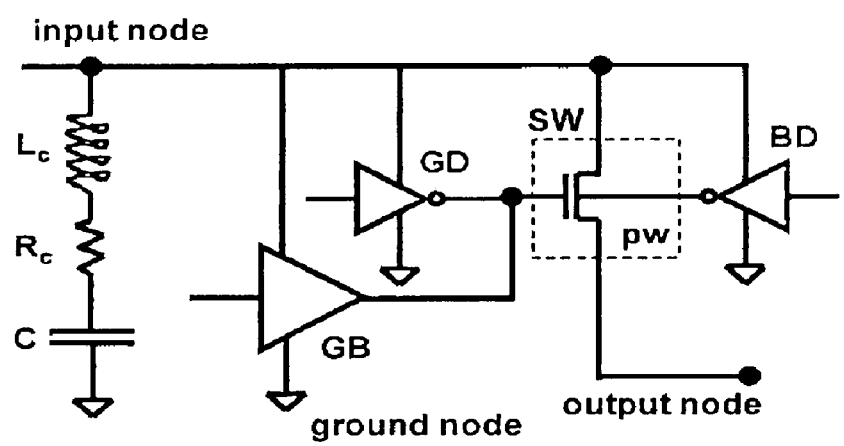
Figure 4: Integrated Circuit Switch and Drive Architecture
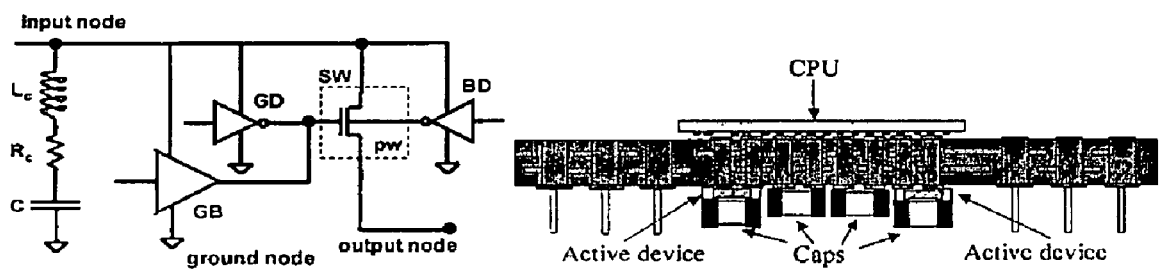
Figure 5: Transistor Switch, Drive and Packaging Architecture

VOLTAGE DROOP SUPPRESSING ACTIVE INTERPOSER

CROSS-REFERENCE TO RELATED DOCUMENTATION

This application relates to USPTO DD 554540 dated the 31$^{st}$ of May 2004, entitled "Transient Suppressing Active Interposer".

TECHNICAL FIELD OF THE INVENTION

Embodiments of the invention relate to electronic circuitry commonly employed to provide regulated voltages to other electronic, electromechanical or electro-optic devices and systems. Such circuitry falls under the broad category of power delivery management electronics.

BACKGROUND & PRIOR ART

Capacitors are commonly employed in electronic systems to store charge and minimize voltage excursions caused by fast load current variations. In order to maximize capacitor effectiveness, these devices are often physically placed at very close proximity to load devices. An example of such placement is the attachment of capacitors to the package substrate of microprocessors (CPU's) wherein the capacitors are mounted on the opposite side of the substrate, facing the processor chip, in order to minimize the physical and electrical distance from the processor power grid and the stored charge within the capacitors. This facilitates faster charge transfer from the capacitors to the CPU power grid and significantly minimizes voltage noise on the power grid.

Prior art packaging of high-performance VLSI components are illustrated in FIGS. 1 and 2. In FIG. 1, a high-performance VLSI package includes a very large scale integrated circuit component labeled 'Microprocessor', attached to a substrate labeled 'Package Substrate', and a thermally conductive object labeled 'Heat Spreader' attached to the VLSI component and the substrate. Also, pluralities of passive devices labeled 'Capacitors' are attached under the package substrate. The high-performance VLSI package is placed in an electronic socket mounted on a larger substrate labeled 'Motherboard'. In FIG. 2, a VLSI package includes a VLSI chip labeled 'CPU' attached to a package substrate. Active electronic circuit components labeled 'Active device' are attached beside passive components such as capacitors labeled 'Caps' on the underside of the package substrate that is directly opposite to the VLSI component mounted on the package substrate.

Greater levels of integration of transistors devices within a microprocessor, a consequence of device scaling, leads to greater power consumption despite the reduction in operating voltages. This leads to increasing operating currents, and consequently an increased need for stored charge in close proximity to the microprocessor. While capacitor technology continues to scale, providing increased capacitance values within the same or smaller form factors, the noise created by state-transitions of CPU's, referred to as voltage droops and overshoots, requires alternate, active techniques that improve the effectivity of capacitance charge storage.

Active devices have been designed in the art to attempt to minimize power grid noise on CPU, and have been assembled in close proximity to the CPU alike capacitors as indicated in FIG. 1. This solution suffers from two primary disadvantages:

- The active devices occupy real-estate on the package substrate, displacing capacitors
- The electrical path from the capacitors feeding the active devices and then into the CPU from the active devices is slow because of the physical distance between the circuits and the capacitors feeding them with electrical charge.

These disadvantages greatly diminish the effectivity of the active circuits employed for noise reduction, and a need exists for improvement upon this power system architecture.

INVENTION SUMMARY

The invention proposes an interposer assembly architecture for noise suppression circuits on a CPU package. In this architecture, called the "Transient Suppressing Active Interposer", charge is stored on dedicated capacitors at a voltage substantially higher than the operating voltage of the CPU. These capacitors are mounted upon the active circuits that are packaged to match the size and form factor of the capacitors and this assembly is then attached to the package substrate. Charge is conveyed to the capacitors dedicated to the active noise suppression function through electrical circuit pathways in the package substrate. These circuit pathways connect to the capacitor terminals through the package of the active noise suppression devices. Depending upon the capacitor construction, these terminals may either be double-sided contact terminals along the edge of the active device's package, or may be feed-through contacts. The active device attaches to the package substrate through both edge terminals and terminals built-up on the surface of the chip, increasing it's number of electrical pathways into the package substrate, matching the package substrate interconnect and reducing the electrical impedance of the charge flow path. The circuits within the active device may be any combination of semiconductor switches and/or voltage regulators, and may also contain voltage and current sensing circuitry. The charge transfer switches are designed with control circuitry that dynamically modulate the turn-on threshold voltage of the switches and maintain the switches at an operating point very close to actual turn-on. These enhancements ensure very fast turn-on action for the switches improving voltage droop suppression capability.

BRIEF DESCRIPTION OF THE DRAWINGS

FIG. 1 illustrates a prior art assembly of capacitors on a high-performance VLSI package FIG. 2 is an illustration of prior art assembly of active devices on a VLSI package FIG. 3 illustrates the cross-section of an embodiment of a package with the proposed assembly of noise-suppressing active circuits and capacitors on a high-performance VLSI package.

FIG. 4 illustrates a preferred embodiment of the active circuits of the invention.

FIG. 5 illustrates the key concepts forming a preferred embodiment of the invention.

DETAILED DESCRIPTION

FIG. 3 illustrates the invention packaging architecture. This architecture is advantageous in two distinct ways. Firstly, it does not displace any of the existing capacitors as compared with the prior art. Second, it amplifies the charge storage capability in some of the capacitors through the isolation provided between capacitors dedicated to active noise suppression and the CPU power grid, which enables the use of a substantially higher voltage for charge storage on the dedicated capacitors.

The active interposer component of the invention architecture comprises of electronic circuits that sense noise on the CPU power grid or obtain signals from the CPU about impending changes of state, such as transition to its 'active' state from a 'standby' state. Based on this information gathered, the circuits activate either high-voltage tolerant switches, or fast voltage regulators such as linear regulators enabling high current flow into the CPU power grid at the required instant. Because of the very close proximity of the noise suppression circuits to the dedicated capacitor in the invention architecture, charge flow is limited primarily by the parasitic inductance and resistance of the dedicated capacitor and the parasitic inductance and resistance of the charge flow path from the noise suppression active device into the CPU through the package substrate. Since charge stored in the capacitor is given by $Q=C*V$, where V is the charge storage voltage, the total charge stored is amplified by the ratio of V to the operating voltage of the CPU. For example, if charge is stored at 12V in the dedicated noise suppression capacitor, and the CPU operating voltage is 1.2V, the increase in charge stored is as much as 9 times. Note that not all this additional charge may be usable, since the noise suppression circuitry requires some voltage difference between the voltage on the capacitor and the CPU power grid for the conduction of charge. Despite this limitation, the invention architecture allows for maximal exploitation of the energy storage capacity of the capacitors on a package.

The architecture and charge transfer method employed in the circuits that form the interposer component are designed for high speed, self-activated charge transfer, and low manufacturing cost, to match the cost of the capacitors themselves. Prior art has proposed the use of linear regulators for high speed and bandwidth. The bandwidth of such regulation systems is reduced by the overall control loop delay that is the sum of the delays in the sensing of a voltage droop or a fast current ramp, the amplification of this signal and the drive of a linear pass transistor. Very fast linear regulators therefore need advanced fabrication processes of very fine lithography, or processes with very fast transistor devices in order to match the bandwidth of the noise created on multi-gigahertz CPU power grids. This conflicts with the requirement for low-cost and the high voltage tolerance, and solutions in the art are therefore relatively quite expensive.

FIG. 4 illustrates one embodiment of the charge transfer capability of the invention. In FIG. 4, an input node connects to a high-voltage input filter and to one channel node of a CMOS switch transistor device. The other channel node of the switch device connects to the output node, while the gate node and the bulk node of the CMOS switch device are controlled by secondary circuits that regulate the flow of charge through this switch device from the input node to the output node.

The proposed invention dispenses with complex control loops for voltage regulation and replaces them with an intrinsically regulating circuit architecture that is also designed with a dynamic threshold voltage modulation technique for increased speed as in FIG. 4. In one embodiment, the integrated circuit chip is fabricated on an n-type substrate, and an NMOSFET transistor constructed in a p-well structure is used as the stitch transistor connecting between the input and output nodes of the chip. A CMOS inverter with its power inputs connecting to the input node voltage and ground drives the body node of the NMOSFET at the well contact of the p-well. A drive sub-circuit, with a constant-bias circuit paralleled to a binary switching drive circuit, also connecting between the input node and ground, drives the gate of the NMOSFET. In the non-conducting state of the switch transistor, the inverter output connecting to the body node is at ground potential, and the drive sub-circuit maintains the gate bias at a voltage that produces a very small current through the switch channel. In this mode, the threshold voltage value of the switch is high due to the fact that the voltage at the source node of the NMOSFET switch, connected to the CPU power grid, is around 1V, and the voltage at it's body node is at ground potential, thereby reverse-biasing the body-source PN junction. At the same time, the gate bias is higher than the CPU power grid voltage by a value approximately equal to that of the higher threshold voltage. In this state of the switch, the NMOSFET device, because of the capacitance to voltage characteristics of MOSFET devices near turn-on, displays the least gate capacitance. This is advantageous, because the coupling of noise voltages from the source to the gate is proportional to the gate capacitance. Also, with a high threshold voltage, the gate drive can be maintained at a value substantially above ground potential with the switch in its non-conducting state, thereby minimizing the swing of voltage required at the gate to move the drive up to it's full value of the chip input node voltage. In this condition of the embodiment, the NMOSFET switch acts as a voltage-follower circuit, where the output voltage at the source tends to follow the input gate drive. Hence if the voltage at the source node tends to fall, the switch starts to move into it's conducting state, conveying substantially higher current to the source node in order to bring the voltage up. In other words, the switch acts as a voltage regulator that attempts to minimize the downward excursions of voltage at the source node. This behavior therefore helps to contain high frequency noise on the CPU power grid depending upon the speed of response of the static biasing circuits of the drive sub-circuit and the impedance presented by the drive sub-circuit at the gate node of the switch. The lower the output impedance of the drive sub-circuit, the lesser the coupling of node voltage variations from the source node to the gate node, through the low gate capacitance of the non-conducting state, and the greater the transient difference in voltage between the gate node and the source node in the event of a negative voltage excursion on the source node, leading to transient channel current flow increase that attempts to reduce the noise at the source node. Along with this inherent regulation action, the switch in its non-conducting state is positioned for a fast turn-on. This occurs as follows. Upon the detection, or intimation of an event requiring sudden, high flow of current, the body-biasing inverter switches it's output from ground potential to the input node potential, thereby forward-biasing the PN junction between the p-well and the n-source nodes. This results in current flow through the PN junction and an immediate reduction in the threshold voltage of the NMOSFET switch to below its nominal threshold value. Simultaneously, the drive sub-circuit pulls the gate bias to the input node voltage as well, providing a strong gate drive. Because of the pre-existing high gate bias in the non-conducting state, this transition of the gate voltage to the full turn-on voltage also occurs rapidly. The combination of these two events begins conduction through the NMOSFET switch very rapidly, providing charge into the CPU power grid from the higher voltage at the input power node supported by the charged capacitor dedicated to this function. During the transition back to the non-conducting state, this embodiment also provides a 'soft-break' switch function through the conduction path in the body-bias sub-circuit and the forward-biased PN junction. Here, the NMOSFET is switched off by pulling the gate drive to ground, while the body-bias inverter remains in it's high state for a short duration after the switch conduction is stopped to allow the energy stored in the inductive parasitic of the capacitor to dissipate into the CPU power grid. The remnant energy also assists in faster charge transfer in an immediately following charge request.

By sidelining the control loops implemented in prior art, the inherent regulation action of the invention allows for the fastest possible response to voltage droop events on the output node. This allows for the fabrication of the invention architecture and circuits on low-cost CMOS fabrication processes. Aided further by detection circuits and/or signals from the load device, the invention provides the required charge in a charge-sharing fashion from the capacitor of the invention to the load capacitance. The isolation thus provided between these capacitances allows for the use of the maximum tolerated voltage on the invention capacitance, multiplying its effectivity substantially.

In an event of very high chip temperature, the above-described embodiment may indicate to the CPU that it is not ready to supply charge, enabling the CPU to accordingly delay its state transitions. Such communication between the CPU and the invention is accomplished at high speed and low cost because of the proximity of the invention to the CPU within the CPU package that eliminate the requirement for any external pins for such communication, and makes use of CPU and package contact bumps and vertical interconnect pathways instead.

Circuit interconnect pathways within the integrated chip of the invention are carefully designed to minimize inductive parasitics. For example, the input current pathways to the switch transistor and the output current pathways from the switch transistor are place adjacent to each other, and in an alternating manner, such that an output pathway is surrounded on both sides, and if possible, on layers above and below the layer containing this pathway, by input pathways, and vice-versa. Based on the current flows expected, ground pathways are also interspersed between the input and output current pathways to provide maximum magnetic field cancellation. By employing wide power metal and thick metallization layers, the resistance in the input and output pathways are also minimized. This helps in maintaining the voltage drop and energy loss in these parasitic elements to a minimum, and maximizes the effectivity of the solution provided by the invention.

As a consequence of the minimization of the voltage droop, the invention also minimizes the voltage overshoot, since the overshoot following the droop is a damped reverse excursion of the very same (droop) excitation on the load power grid. Therefore, the devotion of some of the capacitors on the CPU package to the invention architecture does not in any way impact the overshoot adversely. Unilateral, substantial charge transfer provided by the invention acts akin to a highly non-linear damping element in the power delivery pathways.

Particular attention must be paid to the fabrication and packaging of the active interposer. In one embodiment, the component is designed and fabricated in a semiconductor process chosen so as to provide the necessary low pathway resistances in the active circuits integrated, such that this is accomplished within the form factor of the capacitor associated with it. Electrical contacts are built up on this component both at the edges, to mate with typical capacitors terminals, and on the surface area of the component, to mate with the package substrate. The semiconductor wafer may be thinned using known processes for semiconductor wafer thinning, and individual chips are separated. The chip is subsequently packaged in a modified chip-scale packaging technique that provides electrical connectivity to input and ground edge terminals at the backside and to output and ground terminals on the surface. The active interposer package may include direct electrical connectivity between the ground terminals at the edge and the ground terminals on the surface to minimize the ground path resistance.

In another embodiment, the packaged chip mounting two capacitors on its backside may be employed as a space-saving architecture for typical DC-to-DC conversion. In such architecture, the two capacitors serve the functions of input and output filters respectively, and an integrated inductor may be employed within the chip for higher efficiency in voltage regulation.

FIG. 5 provides a combined view of the key concepts of the invention. It will be evident to one skilled in the art that all the concepts of the invention are essential to a practical implementation.

Although specific embodiments are illustrated and described herein, any circuit arrangement configured to achieve the same purposes and advantages may be substituted in place of the specific embodiments disclosed. This disclosure is intended to cover any and all adaptations or variations of the embodiments of the invention provided herein. All the descriptions provided in the specification have been made in an illustrative sense and should in no manner be interpreted in any restrictive sense. The scope, of various embodiments of the invention whether described or not, includes any other applications in which the structures, concepts and methods of the invention may be applied. The scope of the various embodiments of the invention should therefore be determined with reference to the appended claims, along with the full range of equivalents to which such claims are entitled. Similarly, the abstract of this disclosure, provided in compliance with 37 CFR §1.72(b), is submitted with the understanding that it will not be interpreted to be limiting the scope or meaning of the claims made herein. While various concepts and methods of the invention are grouped together into a single 'best-mode' implementation in the detailed description, it should be appreciated that inventive subject matter lies in less than all features of any disclosed embodiment, and as the claims incorporated herein indicate, each claim is to viewed as standing on it's own as a preferred embodiment of the invention.

What is claimed is:

1. An integrated electronic circuit apparatus, comprising:

An integrated circuit chip containing a plurality of integrated semiconductor and other electronic devices;

An electronic package including the integrated circuit chip, with an array of electrical terminals accessible at a first surface of the package for the attachment of capacitor devices, and an array of terminals on a second surface, opposite to the first surface, for the attachment of the electronic package to a substrate, and wherein the package has dimensions and electrical terminals are designed to match exactly with those of the capacitor devices attached to it;

One or more active devices attached to the electronic package at its first surface;

One or more capacitor devices attached to the barren surface of one or more active devices to form a stacked package on the electronic package with one or more active devices;

A first input node of the electronic package, connecting to a terminal of the capacitor device through one or more active devices and to one channel terminal of a first transistor on the integrated circuit chip;

A second output node of the chip, connecting to the other channel terminal of the first transistor and to one or more terminals at the second surface of the electronic package;

And a third ground node connecting to terminals at the first and second surfaces of the electronic package.

2. The apparatus of claim 1 wherein the array of electrical terminals on the first surface of the package are derived as metal strips insulated from, and routed along, the edges of the integrated circuit chip and connecting to metal pads at the periphery of the integrated circuit substrate.

3. The apparatus of claim 1 wherein via metallization passing through a silicon substrate on which the integrated chip is fabricated makes electrical connection to terminals on the first surface of the package.

4. The apparatus of claim 1 wherein the attached capacitors are devices with a plurality of terminals designed for very low parasitic inductance such as interdigitated capacitors (IDCs) or 'array' capacitors.

5. The apparatus of claim 1 wherein the electronic package is attached directly opposite to the CPU on a package substrate such that the physical distance between circuits on the CPU and the circuits in the invention apparatus is approximately the thickness of the CPU package substrate.

6. The apparatus of claim 1 wherein the integrated circuit chip contains a distributed, integrated capacitor connecting to the first input node.

7. The apparatus of claim 1 wherein the integrated circuit chip performs the function of the conversion of an input DC voltage to an output DC voltage.

8. The apparatus of claim 1 wherein the integrated circuit chip includes integrated magnetic inductors for the switched conversion of an input DC voltage to an output DC voltage.

9. Electronic systems comprised of various integrated and discrete electronic circuits and devices, electrochemical, electro-thermal, electromechanical and electro-optic devices that employ the apparatus of claim 1 in any embodiment.

* * * * *